(12) United States Patent
Hirata

(10) Patent No.: US 6,774,399 B2
(45) Date of Patent: Aug. 10, 2004

(54) ACTIVE-MATRIX SUBSTRATE AND METHOD OF FABRICATING THE SAME

(75) Inventor: Kazumi Hirata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/095,074

(22) Filed: Mar. 12, 2002

(65) Prior Publication Data

US 2002/0149018 A1 Oct. 17, 2002

(30) Foreign Application Priority Data

Mar. 13, 2001 (JP) ........................................ 2001-070218

(51) Int. Cl.$^7$ ........................ H01L 31/036; H01L 21/84
(52) U.S. Cl. .............................. 257/72; 257/59; 257/60; 257/61; 257/72; 257/74; 257/70; 257/71
(58) Field of Search ............................. 257/59, 50, 72, 257/71, 74, 21, 66, 69; 438/46, 149, 151, 155, 157, 150; 349/141, 39, 139

(56) References Cited

U.S. PATENT DOCUMENTS

| | | | | |
|---|---|---|---|---|
| 5,327,268 A | * | 7/1994 | Takabatake et al. | .......... 359/59 |
| 5,585,951 A | * | 12/1996 | Noda et al. | ................. 349/122 |
| 5,920,084 A | * | 7/1999 | Gu et al. | ....................... 257/59 |
| 5,981,974 A | * | 11/1999 | Makita | ......................... 257/72 |
| 6,204,905 B1 | * | 3/2001 | Koma et al. | ................. 349/138 |
| 6,259,200 B1 | * | 7/2001 | Morita et al. | ............... 313/498 |
| 6,277,679 B1 | * | 8/2001 | Ohtani | ........................ 438/151 |
| 6,372,558 B1 | * | 4/2002 | Yamanaka et al. | .......... 438/149 |
| 6,404,474 B1 | * | 6/2002 | Watanabe et al. | ........... 349/141 |
| 6,426,245 B1 | * | 7/2002 | Kawasaki et al. | .......... 438/166 |
| 6,480,577 B1 | * | 11/2002 | Izumi et al. | .................. 379/40 |
| 6,501,096 B1 | * | 12/2002 | Hashimoto et al. | ........... 257/59 |
| 2001/0000755 A1 | * | 5/2001 | Hirakata et al. | ............ 438/149 |
| 2001/0010572 A1 | * | 8/2001 | Koma et al. | ................ 349/130 |

* cited by examiner

*Primary Examiner*—Nathan J. Flynn
*Assistant Examiner*—Fazli Erdem
(74) *Attorney, Agent, or Firm*—Sughrue Mion, PLLC

(57) ABSTRACT

An active-matrix substrate is provided, which suppresses the unevenness of its surface due to the height difference of the TFTs and gate and data lines from the remaining area. After TFTs, gate lines, and data lines are formed on a transparent base, a transparent dielectric layer is formed on the base to cover the TFTs, the gate lines, and the data lines. The dielectric layer is selectively etched to form transparent dielectric portions arranged in a matrix array in such a way as to form a first plurality of recesses extending along the respective gate lines and a second plurality of recesses extending along the respective data lines. Each of the portions has a thickness equal to or greater than the maximum height of the TFTs, the gate lines, or the data lines, and a distance equal to or greater than the thickness thereof from a corresponding one of the TFTs, the gate lines, or the data lines. A planarization layer is then formed to fill at least the first plurality of recesses and the second plurality of recesses. Pixel electrodes are arranged on or over the flat surfaces of the respective portions. The connection part of each pixel electrode is connected to a corresponding one of the TFTs by way of a corresponding one of holes of the planarization layer.

17 Claims, 10 Drawing Sheets

ACTIVE-MATRIX SUBSTRATE AND METHOD OF FABRICATING THE SAME

BACKGROUND OF THE INVENTION

1. Field of the Invention

The present invention relates to an active-matrix substrate used for Liquid-Crystal Display (LCD) devices, and a method of fabricating the same. More particularly, the invention relates to an active-matrix substrate comprising a dielectric plate and switching elements such as Thin-Film Transistors (TFTs) arranged in a matrix array on the plate, and a method of fabricating the substrate.

2. Description of the Related Art

In recent years, active-matrix addressing LCD devices using TFTs as their switching elements have been developed and used practically. LCD devices of this type comprise typically an active-matrix substrate on which gate lines, drain lines and TFTs are regularly arranged; an opposite substrate on which a color filter and a black matrix are formed; and a layer of liquid crystal sandwiched by the active-matrix substrate and the opposite substrate. On operation, a proper voltage is applied across the electrodes formed on the active-matrix substrate and the corresponding electrode or electrodes formed on the opposite substrate, or across the relating electrodes formed on the active-matrix substrate. Thus, the molecules of the liquid crystal are rotated to the specific orientations at the respective pixels according to the applied voltage to thereby change the transmission/reflection characteristic of light at the pixels, thereby displaying desired images on the screen of the LCD device.

With active-matrix addressing LCD devices, it is important to strictly control the orientation of the molecules of the liquid crystal to generate desired high-resolution and high-quality images. To realize this, it is required to enhance the accuracy of substrate flatness, electrode shape, electrode intervals, and so on.

FIG. 1 shows the structure of a prior-art active-matrix substrate of the LCD device of this type, which is fabricated in the following way. Although the substrate actually comprises TFTs, gate lines, and data lines, only one of the TFTs is shown in FIG. 1 for the sake of simplification.

First, a semiconductor layer, which is typically made of amorphous silicon or polycrystalline silicon, is formed on a transparent glass plate 101 and then, it is patterned by using popular photolithography and dry-etching techniques, forming semiconductor islands 112 on the plate 101.

Nest, a silicon dioxide ($SiO_2$) layer 117a is formed on the whole surface of the plate 101 to cover the semiconductor islands 112 and patterned, thereby forming gate dielectric layers 117a on the islands 112 for the respective TFTs 102. The remaining layer 117 covers the surface of the plate 101.

A conductive layer is formed to cover the $SiO_2$ layer 117 and the gate dielectric layers 117a over the whole plate 101 and patterned, thereby forming gate electrodes 107a and gate lines (not shown in FIG. 1). The gate lines are connected to the respective electrodes 107a. In other words, specific parts of each gate line serve as the gate electrodes 107a.

Proper dopant atoms are selectively introduced into the semiconductor islands 112 in self-alignment with respect to the corresponding gate electrodes 107a by the ion-implantation method, thereby forming a source region and a drain region in each of the islands 112. The remaining part of each island 112 between the source and drain regions, which is located below the gate electrode 107a, forms a channel region.

A silicon nitride ($SiN_x$) layer 118 is formed on the $SiO_2$ layer 117a to cover the gate electrodes 107a and the gate lines over the whole plate 101. The layer 118 serves as an interlayer dielectric layer. Then, the layer 118 is selectively removed by the etching method in the peripheral area of each of the islands 112, thereby forming two contact holes that expose the source and drain regions or each island 112 by way of the $SiO_2$ and $SiN_x$ layers 117 and 118, respectively.

A conductive layer is formed on the interlayer dielectric layer 118 of $SiN_x$ over the whole plate 101 and patterned, thereby forming a source electrodes 108a and a drain electrode 108b for each of the TFTs 102, and data lines (not shown in FIG. 1) over the plate 101. The data lines are connected to the corresponding source electrodes 108a of the TFTs 102. Each of the source electrodes 108a is contacted with the source region of the semiconductor island 112 by way of its contact hole. Each of the drain electrodes 108b is contacted with the drain region of the island 112 by way of its contact hole.

Through the above-described process steps, the ThTs 102, the gate lines, and the data lines are fanned on the plate 101.

Subsequently, a thick, transparent, dielectric planarization layer 106 is formed on the interlayer dielectric layer 118 to cover the TFTs 102 and the gate and data lines. Contact holes 116 are formed to penetrate the layer 106 at the locations just above the respective source electrodes 108a. These contact holes 116 are to expose the underlying source electrodes 108a from the layer 106.

A transparent conductive layer such as Indium Tin Oxide (ITO) is formed on the planarization layer 106 and patterned, thereby forming pixel electrodes 109 in the respective pixel regions on the layer 106. Each of the pixel electrodes 109 is contacted with a corresponding one of the source electrodes 108a of the TFT 102 by way of its contact hole 116 of the planarization layer 106.

Thus, the prior-art TFT substrate of FIG. 1 is fabricated.

On the other hand, a color filter for red (R), green (G) and blue (B) colors and a black matrix for blocking unnecessary light among the pixels are formed on a transparent glass plate. Thus, an opposing substrate is formed.

Following this, the active-matrix substrate and the opposing substrate are fixed together to keep a specific gap between them with spacers. A specific liquid crystal is filled into the gap and sealed. Thus, the active-matrix LCD device is fabricated.

With the above-described prior-art active-matrix substrate of FIG. 1, the planarization layer 106 is formed to reduce the height difference between the areas including the TFT 102 and the gate and data lines and the other area. However, there is a problem that the height difference is not sufficiently reduced as desired with the use of the layer 106.

In particular, each pixel electrode 109 is raised at its end part 109a near the corresponding TFT 102 with respect to the surface of the plate 101 corresponding to the surface inclination of the layer 106, as shown in FIG. 1. Therefore, the gap between the active-matrix substrate of FIG. 1 and the opposing substrate varies and therefore, the voltage applied across these two substrates becomes non-uniform. This results in a problem of degradation of image quality. This problem is caused by the fact that the TFTs 102 (and the gate and data lines) generate protrusions of the planarization layer 106 and at the same time, each of these protrusions is considerably wide.

To solve the above-described problem, the inventor created the following improvement and submitted it as a Japanese patent application.

Specifically, prior to the formation of the TFTs, a transparent dielectric layer is selectively formed on a transparent plate except for the areas for the TFTs and the gate and data lines. The transparent dielectric layer has a thickness equal to or greater than the height difference between the areas including the TFTs and the gate and data lines and the other area. With this technique, the area for each pixel electrode is planarized by the transparent dielectric layer and therefore, the above-identified problem can be solved.

The structure of the active-matrix substrate and a method of fabricating the same according to the above-described inventor's improvement are explained below with reference to FIGS. 2A to 2C. FIG. 2C is a plan view showing the arrangement of the pixels including the TFTs, the gate and data lines, and the pixel electrodes. FIGS. 2A and 2B are cross-sectional view along the line IIB—IIB in FIG. 2C before and after the TFTs are formed, respectively.

First, transparent dielectric layer 113 is formed on a glass plate 101. The layer 113 has a thickness greater than the height difference H of the TFTs 102 from the surface of the plate 101. Then, the layer 113 is selectively removed by using known photolithography and etching techniques in such a way as to be left on the areas that exclude the TFTs 102 and the gate and data lines. In these areas, the pixel electrodes 109 are formed in the later process steps. The layer 113 is made of, for example, $SiO_2$. The removed parts of the layer 113 form recesses 105a and 105b on the plate 101. The recesses 105a, each of which has an approximately rectangular cross-section, are formed to extend in a horizontal direction in FIG. 2C along the respective gate lines 107. The recesses 105b, each of which has an approximately rectangular cross-section, are formed to extend in a vertical direction in FIG. 2C along the respective data lines 108. The recesses 105a and 105b form rectangular pixel regions, as clearly shown in FIG. 2C.

Thereafter, the TFTs 2 having the same structure as shown in FIG. 1 are formed near the respective intersections of the recesses 105a and 105b. The pixel electrodes 109 are formed on the remaining transparent dielectric layer 113 in the respective pixel regions. The pixel electrodes 109 are connected to the source electrodes 108a of the corresponding TFTs 102 by way of the relating connection parts 110 of the electrodes 109. The connection parts 110 are extended over the height-different portions between the TFTs 102 and the pixel regions. The TFTs 102, the gate lines 107, and the data lines 108 are all located in the recesses 105a and/or 105b.

As shown in FIG. 2C, the gate lines 107 are extended horizontally in the respective horizontal recesses 105a while the data lines 108 are extended vertically in the respective vertical recesses 105b. The TFTs 102 are located near the respective intersections of the gate and data lines 107 and 108 (or, the recesses 105a and 105b).

With the active-matrix substrate according to the inventor's improvement shown in FIGS. 2A to 2C, the recesses 105a and 105b are small in width and occupy narrow areas compared with the size of the plate 101. On the other hand, the surface of the remaining transparent dielectric layer 113 is flat and occupies a wide area of the plate 101. As a result, it may be said that almost all the surface of the active-matrix substrate is flat, which leads to the solution of the above-described problem.

With the method of fabricating the active-matrix substrate according to the inventor's improvement shown in FIGS. 2A to 2C, however, there is a disadvantage that the patterning accuracy for the formation of the TFTs 102 is difficult to be controlled, and that the transparency at the pixel regions deteriorates to darken the displayed images.

Specifically, in this method, the transparent dielectric layer 113 is formed and patterned to form the recesses 105a and 105b and thereafter, the TFTs 102 and the gate and data lines 107 and 108 are formed in the recesses 105a and 105b. Thus, because of the effect of the height difference H between the layer 113 and the bottoms of the recesses 105a and 105b, each photoresist film used therefor has unavoidably a large thickness. As a result, there is a problem that desired fine patterns for the TFTs 102 are difficult to be formed in the respective photoresist films.

Moreover, because of the same reason, dry etching processes need to be carried out for forming the holes or recesses with large aspect ratios and thus, the dimensional accuracy is difficult to be controlled in the dry etching processes. Concretely, for example, when a photoresist film to be used for forming holes or recesses with a depth of approximately 1 $\mu$m has a thickness of approximately 2 $\mu$m, a possible focal point difference will be approximately 1 $\mu$m in the exposure process for the photoresist film. As a result, the dimensional accuracy of the patterned photoresist film will deteriorate.

In addition, as shown in FIG. 3, as the fabrication process steps are carried out, a plurality of interlayer dielectric layers 114 are successively formed on the patterned transparent dielectric layer 113. These dielectric layers 114 are stacked not only on the layer 113 but also along the sidewalls. In particular, the effective thickness of the stacked layers 114 along the sidewalls with respect to the exposing light irradiated will be increased in the regions 120. Therefore, undesired reflection and/or refraction of the exposing light tend to occur in the regions 120, in other words, the regions 120 tends to be transmittance-decreased regions, resulting in quality degradation of displayed images.

SUMMARY OF THE INVENTION

The invention was created to solve the above-described problems or disadvantages of the above-described inventor's improvement of the active-matrix substrate and its fabrication method.

Accordingly, an object of the present invention is to provide an active-matrix substrate that suppresses effectively the unevenness of its surface due to the height difference of the TFTs and gate and data lines from the remaining area, and a method of fabricating the substrate.

Another object of the present invention is to provide an active-matrix substrate that eliminates the difficulty in controlling the dimensional accuracy for the formation of the TFTs, and a method of fabricating the substrate.

Still another object of the present invention is to provide an active-matrix substrate that prevents the optical transmittance of the pixel regions from degrading due to the formation of the planarization layer in the pixel regions, and a method of fabricating the substrate.

The above objects together with others not specifically mentioned will become clear to those skilled in the art from the following description.

According to a first aspect of the invention, an active-matrix substrate is provided. This substrate comprises:

(a) a transparent dielectric base;

(b) gate lines arranged at intervals on the base;

(c) data lines arranged at intervals on the base to intersect with the gate lines, forming intersections;

(d) TFTs arranged near the respective intersections of the gate lines and the data lines;

(e) transparent dielectric portions or islands arranged in a matrix array on the base in such a way as to form a first plurality of recesses extending along the respective gate lines and a second plurality of recesses extending along the respective data lines;

each of the portions forming a pixel regions with a flat surface;

each of the portions having a thickness equal to or greater than a maximum height of the TFTs, the gate lines, or the data lines with respect to a specific reference level;

each of the portions having a distance equal to or greater than the thickness thereof from a corresponding one of the TFTs, the gate lines, or the data lines;

(f) a planarization layer selectively formed to fill at least the first plurality of recesses and the second plurality of recesses; and (g) pixel electrodes arranged on or over the flat surfaces of the respective portions;

each of the pixel electrodes having a connection part formed on the surface of the planarization layer to extend over a corresponding one of the second plurality of recesses;

the connection part being connected to a corresponding one of the TFTs by way of a corresponding one of holes of the planarization layer.

With the active-matrix substrate according to the first aspect of the invention, the transparent dielectric portions are arranged in a matrix array on the transparent dielectric base in such a way as to form the first plurality of recesses extending along the respective gate lines and the second plurality of recesses extending along the respective data lines. Each of the portions has a thickness equal to or greater than the maximum height of the TFTs, the gate lines, or the data lines with respect to the specific reference level. Moreover, each of the portions has a distance equal to or greater than the thickness thereof from the corresponding one of the TFTs, the gate lines, or the data lines.

The planarization layer is selectively formed to fill the first plurality of recesses and the second plurality of recesses.

The pixel electrodes are arranged on or over the flat surfaces of the respective portions. Each of the pixel electrodes has a connection part formed on the surface of the planarization layer to extend over a corresponding one of the second plurality of recesses. The connection part is connected to a corresponding one of the TFTs by way of a corresponding one of holes of the planarization layer.

Accordingly, the pixel electrodes are located on or over the respective flat surfaces of the transparent dielectric portions (i.e., the pixel regions) and at the same time, the connection parts of the pixel electrodes are located on the surface of the planarization layer. The surface of the planarization layer can be formed approximately flat.

As a result, almost all the surface of the active-matrix substrate can be flat. This means that the unevenness of the surface of the active-matrix substrate due to the height difference of the TFTs and the gate and data lines from the remaining area can be suppressed effectively.

Furthermore, the TFTs can be formed on the base by using ordinary fabrication processes before the transparent dielectric portions are arranged in a matrix array on the base. In other words, the TFTs can be formed on the flat base without the portions. Thus, the difficulty in controlling the dimensional accuracy for the formation of the TFTs can be eliminated.

Additionally, the TFTs can be formed on the base before the transparent dielectric portions are arranged on the base and thus, dielectric layers are not stacked along the sidewalls of the portions during the fabrication process sequence. This means that undesired reflection and/or refraction of the exposing light will not occur near the sidewalls. As a result, quality degradation of displayed images is prevented.

In a preferred embodiment of the substrate according to the first aspect, each of the transparent dielectric portions is made of a same material as the planarization layer.

In another preferred embodiment of the substrate according to the first aspect, each of the transparent dielectric portions is made of a material having substantially a same refractive index as that of the planarization layer.

In still another preferred embodiment of the substrate according to the first aspect, each of the transparent dielectric portions has a multi-layer structure of sublayers stacked. The sublayers are made of a same material as each other.

In a further preferred embodiment of the substrate according to the first aspect, each of the transparent dielectric portions has a multi-layer structure of sublayers stacked. The sublayers are made of different materials from each other.

In a still further preferred embodiment of the substrate according to the first aspect, each of the transparent dielectric portions includes a layer made of one selected from the group consisting of $SiO_2$, $SiN_x$, and an organic planarization material.

According to a second aspect of the invention, a method of fabricating the active-matrix substrate according to the first aspect is provided. This method comprises:

(a) providing a transparent dielectric base;

(b) forming TFTs, gate lines, and data lines on the base;

the gate lines being arranged at intervals on the base;

data lines being arranged at intervals on the base to intersect with the gate lines, forming intersections;

the TFTs being arranged near the respective intersections of the gate lines and the data lines;

(c) forming a transparent dielectric layer on the base to cover the TFTs, the gate lines, and the data lines;

(d) selectively etching the transparent dielectric layer to form transparent dielectric portions or islands on the base;

the portions being arranged in a matrix array in such a way as to form a first plurality of recesses extending along the respective gate lines and a second plurality of recesses extending along the respective data lines;

each of the portions forming a pixel regions with a flat surface;

each of the portions having a thickness equal to or greater than a maximum height of the TFTs, the gate lines, or the data lines with respect to a specific reference level;

each of the portions having a distance equal to or greater than the thickness thereof from a corresponding one of the TFTs, the gate lines, or the data lines;

(e) selectively forming a planarization layer to fill at least the first plurality of recesses and the second plurality of recesses; and (f) forming pixel electrodes arranged on or over the flat surfaces of the respective portions;

each of the pixel electrodes having a connection part formed on the surface of the planarization layer to extend over a corresponding one of the second plurality of recesses;

the connection part being connected to a corresponding one of the TFTs by way of a corresponding one of holes of the planarization layer.

With the method according to the second aspect of the invention, the TFTs, the gate lines, and the data lines are formed on the base and thereafter, the transparent dielectric layer is formed on the base to cover the TFTs, the gate lines, and the data lines in the step (c). Then, the transparent dielectric layer is selectively etched to form the transparent dielectric portions on the base in the step (d).

The portions are arranged in a matrix array in such a way as to form the first plurality of recesses extending along the respective gate lines and the second plurality of recesses extending along the respective data lines. Each of the portions forms the pixel regions with a flat surface. Each of the portions has a thickness equal to or greater than the maximum height of the TFTs, the gate lines, or the data lines with respect to the specific reference level. Each of the portions has a distance equal to or greater than the thickness thereof from a corresponding one of the TFTs, the gate lines, or the data lines.

Subsequently, the planarization layer is selectively formed to fill at least the first plurality of recesses and the second plurality of recesses in the step (e).

In the subsequent step (f), the pixel electrodes are formed to be arranged on or over the flat surfaces of the respective portions. Each of the pixel electrodes has a connection part formed on the surface of the planarization layer to extend over a corresponding one of the second plurality of recesses. The connection part is connected to a corresponding one of the TFTs by way of a corresponding one of holes of the planarization layer.

Accordingly, the pixel electrodes are located on or over the respective flat surfaces of the transparent dielectric portions (i.e., the pixel regions) and at the same time, the connection parts of the pixel electrodes are located on the surface of the planarization layer. The surface of the planarization layer can be formed approximately flat in the step (e).

As a result, almost all the surface of the active-matrix substrate can be flat. This means that the unevenness of the surface of the active-matrix substrate due to the height difference of the TFTs and the gate and data lines from the remaining area can be suppressed effectively.

Furthermore, the TFTs are formed on the base in the step (b) by using ordinary fabrication processes before the transparent dielectric portions are arranged in a matrix array on the base in the subsequent step (d). This means that the TFTs can be formed on the flat base without the portions. Therefore, the difficulty in controlling the dimensional accuracy for the formation of the TFTs can be eliminated.

Additionally, the TFTs are formed on the base before the transparent dielectric portions are arranged on the base and thus, dielectric layers are not stacked along the sidewalls of the portions during the fabrication process sequence. This means that undesired reflection and/or refraction of the exposing light will not occur near the sidewalls. As a result, quality degradation of displayed images is prevented.

In a preferred embodiment of the method according to the second aspect, the transparent dielectric layer is made of a same material as the planarization layer.

In another preferred embodiment of the method according to the second aspect, the transparent dielectric layer is made of a material having substantially a same refractive index as that of the planarization layer.

In still another preferred embodiment of the method according to the second aspect, the transparent dielectric layer has a multi-layer structure of sublayers stacked. The sublayers are made of a same material as each other.

In a further preferred embodiment of the method according to the second aspect, the transparent dielectric layer has a multi-layer structure of sublayers stacked. The sublayers are made of different materials from each other.

In a still further preferred embodiment of the method according to the second aspect, each of the transparent dielectric portions includes a layer made of one selected from the group consisting of $SiO_2$, $SiN_x$, and an organic planarization material.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
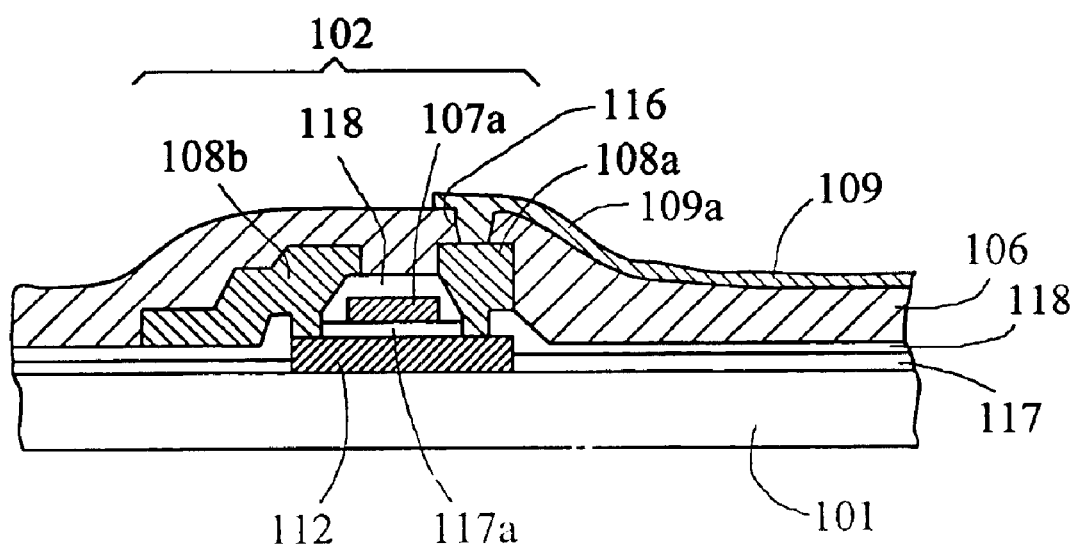
FIG. 1 is a schematic, partial cross-sectional view showing the configuration of a prior-art active-matrix substrate used for LCD devices.
Figure 2A:
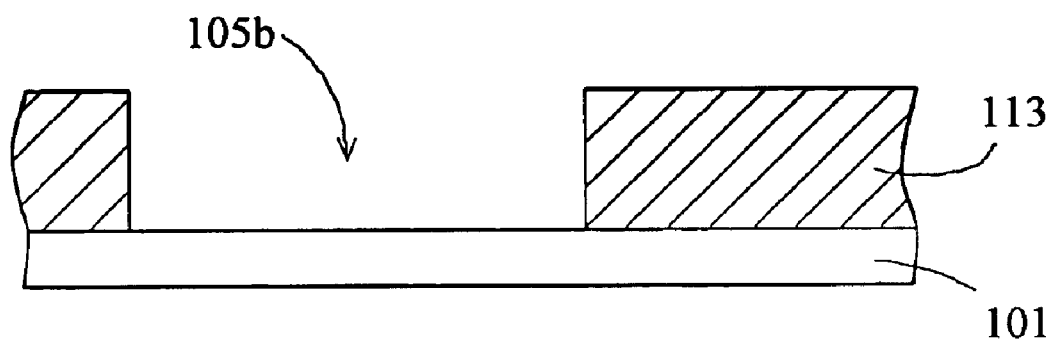
FIGS. 2A and 2B are schematic, partial cross-sectional views along the line IIB—IIB in FIG. 2C, which show a method of fabricating an active-matrix substrate used for LCD devices, respectively, which was created by the inventor and submitted as a Japanese Patent Application.
Figure 2B:
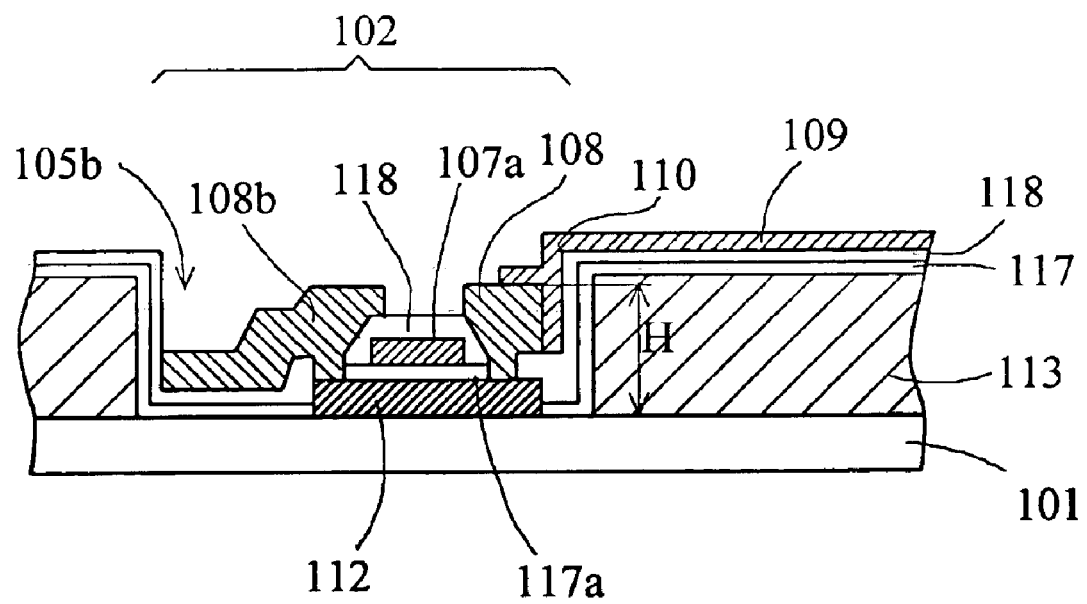
Figure 2C:
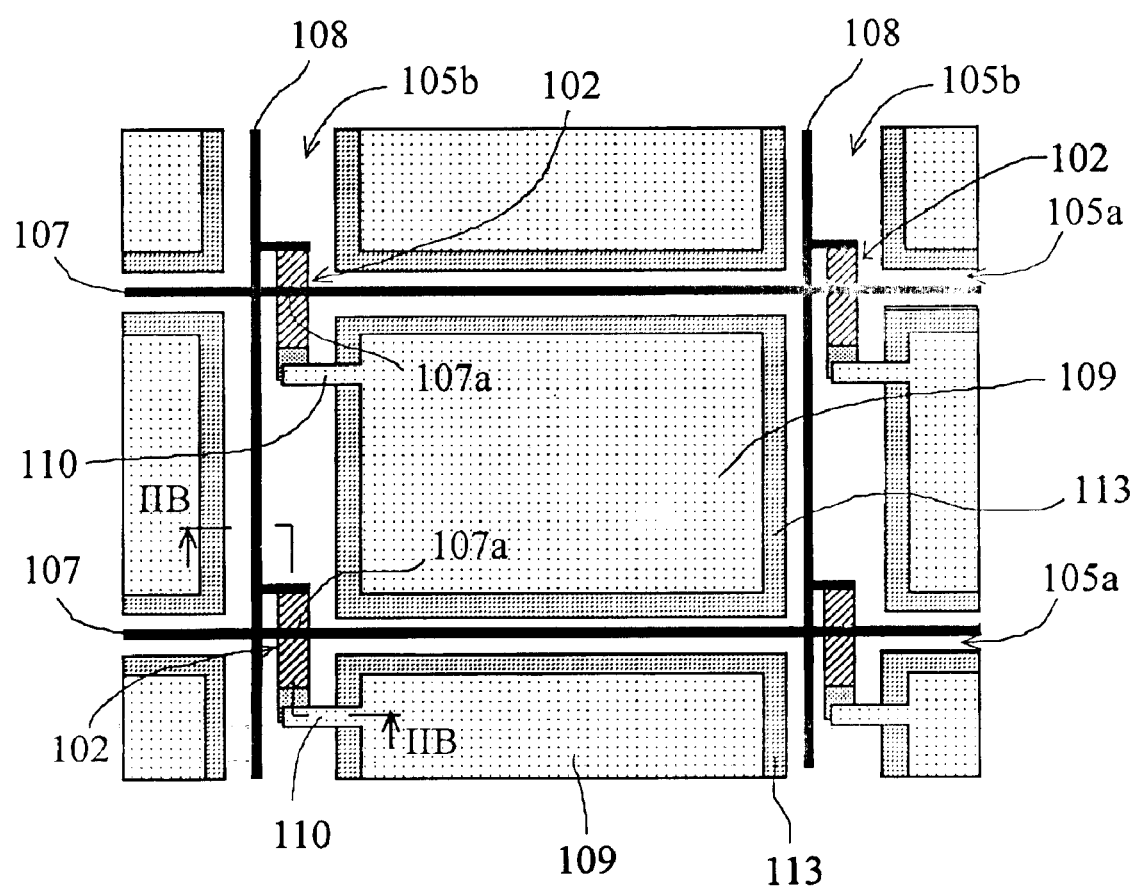
FIG. 2C is a schematic, partial plan view showing the configuration of the active-matrix substrate shown in FIG. 2B.
Figure 3:
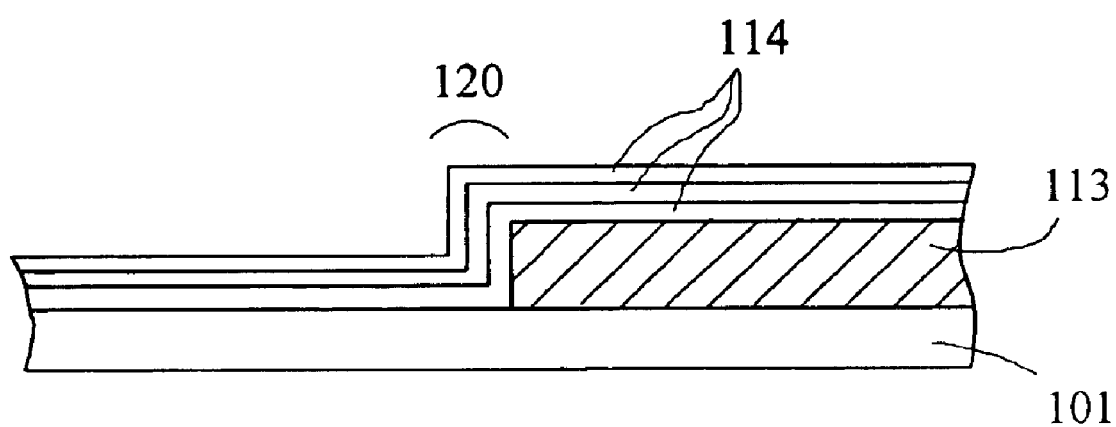
FIG. 3 is a schematic, partial cross-sectional view showing the disadvantage of the active-matrix substrate show in FIG. 2B.

Preferred embodiments of the present invention will be described in detail below while referring to the drawings attached.

FIRST EMBODIMENT

Figure 4:
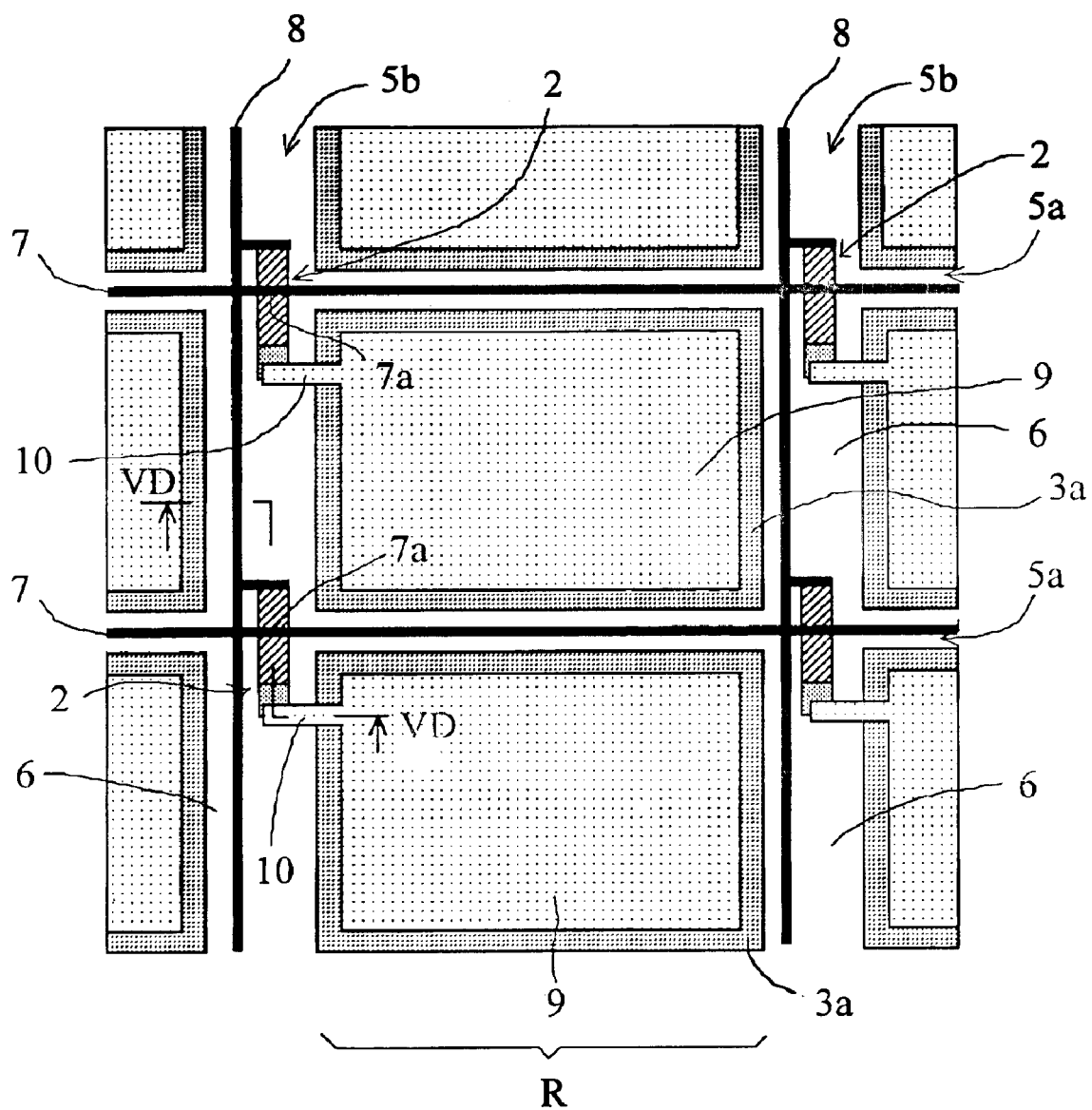
FIG. 4 is a schematic, partial plan view showing the configuration of an active-matrix substrate according to a first embodiment of the invention.
Figure 5A:
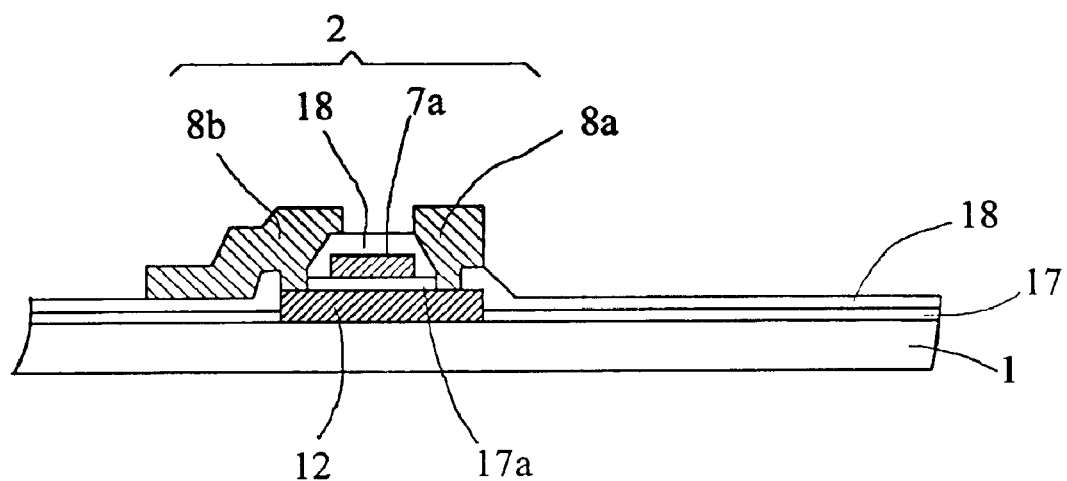
FIGS. 5A to 5D are schematic, partial cross-sectional views along the line VD—VD in FIG. 4, which show a method of fabricating the active-matrix substrate according to the first embodiment of FIG. 4, respectively.
Figure 5B:
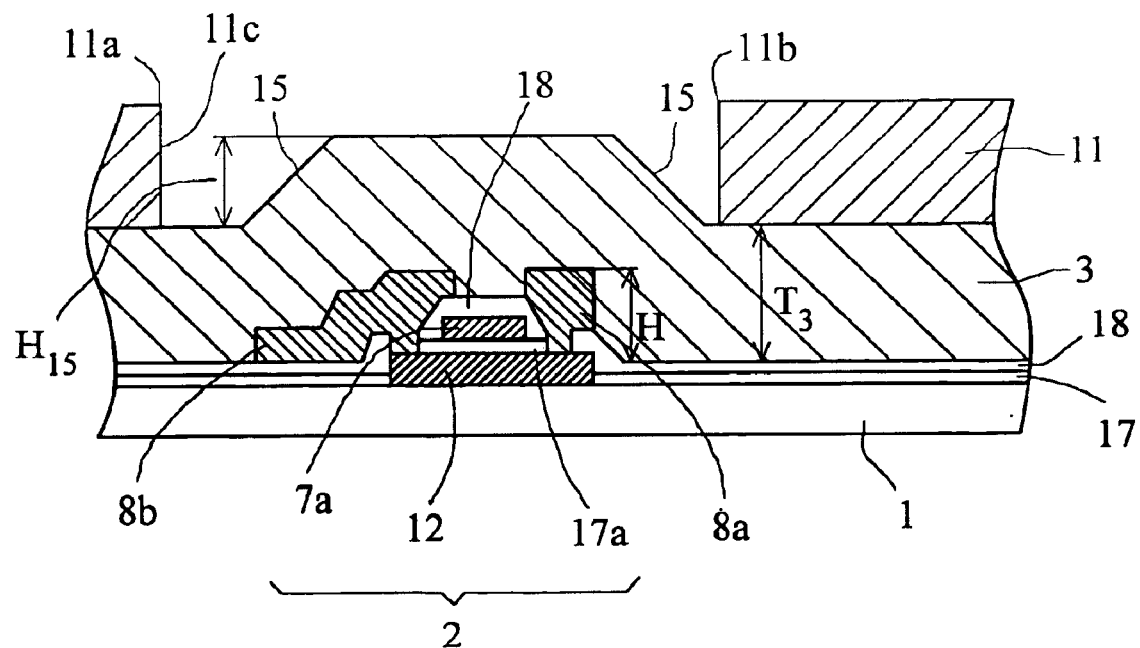
Figure 5C:
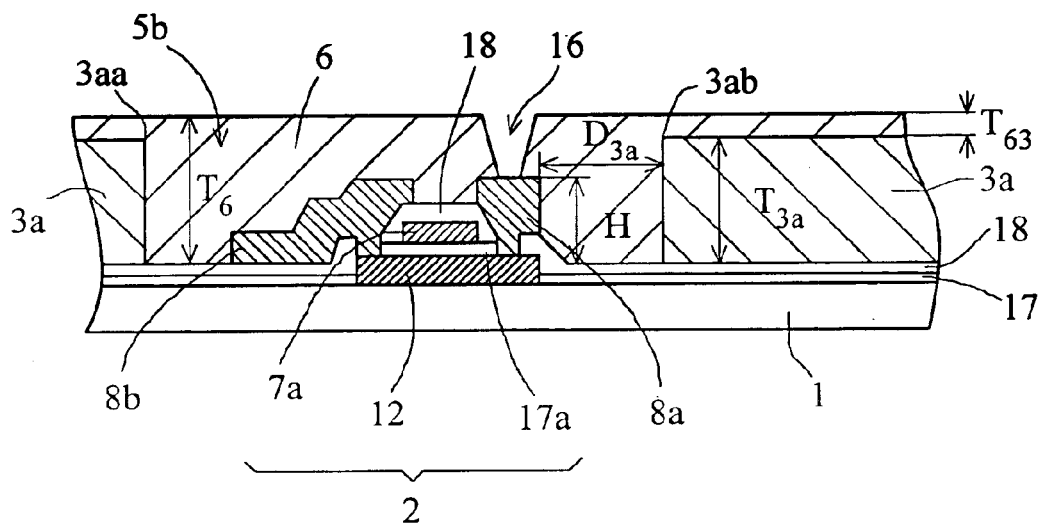
Figure 5D:
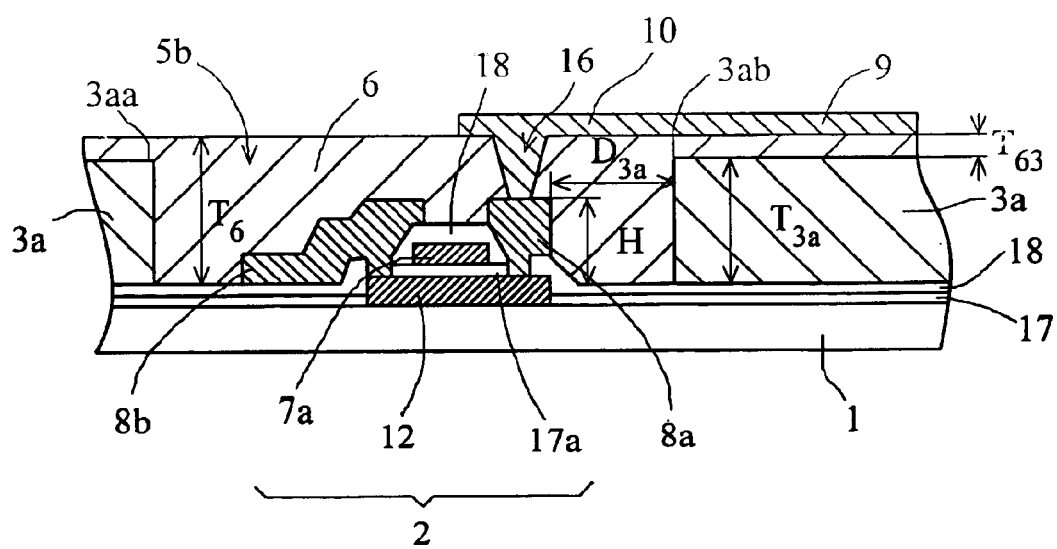

An active-matrix substrate according to a first embodiment of the invention has the configuration as shown in FIG. 4 and FIG. 5D. This substrate is used for an active-matrix addressing LCD device.

As clearly seen from FIGS. 4 and 5D, this substrate comprises a transparent glass plate 1, gate lines 7 arranged over the surface of the plate 1 in a direction at equal intervals, and data lines 8 arranged over the surface of the plate 1 in a perpendicular direction to the gate lines 7 at equal intervals. The gate lines 7 and the data lines 8 are intersected perpendicularly with each other to form a shape of lattice. The gate lines 7 are located in respective recesses 5a extending horizontally in FIG. 4. The data lines 8 are located in respective recesses 5b extending vertically in FIG. 4. These recesses 5a and 5b define rectangular pixel regions R in which pixels electrodes 9 are formed.

This substrate further comprises TFTs 2 arranged near the respective intersections of the gate lines 7 and the data lines 8 in the intersections of the recesses 5a and 5b. The TFTs 2 serve as switching elements.

Each of the TFTs 2 has substantially the same configuration as shown in FIG. 1. Specifically, as shown in FIG. 5D, a semiconductor island 12 (which is typically made of amorphous silicon or polysilicon) is formed on the surface of the plate 1 in a corresponding one of the intersections of the recesses 5a and 5b. A gate dielectric 17a is formed to cover the whole surface of the island 12. The gate dielectric 17a is made of a part of a dielectric layer 17. The layer 17 is formed on the surface of the plate 1 to cover the islands 12. A gate electrode 7a is formed on the gate dielectric 17a. An interlayer dielectric layer 18 is formed on the layer 17 to cover the gate electrodes 7a. A source electrode 8a and a drain electrode 8b are formed on the layer 18 in such a way as to contact respectively a source region and a drain region of the underlying island 12 by way of the corresponding contact holes.

Transparent dielectric portions or islands 3a are arranged in the corresponding pixel regions R on the interlayer dielectric layer 18 in a matrix array. It may be said that the portions 3a are constituted by the recesses 5a and 5b that form a shape of cross stripes. The portions 3a are formed by patterning a transparent dielectric layer 3 formed on the layer 18. The portions 3a have flat surfaces. The portions 3a have the same rectangular plan shape, the same size, and the same thickness $T_{3a}$.

A dielectric planarization layer 6 (thickness: $T_6$) is formed to cover the whole surface of the plate 1. As seen from FIG. 5D, the layer 6 not only fills the whole recesses 5a and 5b but also covers the flat surfaces of the transparent portions or islands 3a. The layer 6 has an approximately flat surface. The layer 6 has a very small thickness $T_{63}$ on the portions 3a. The thickness $T_6$ of the layer 6 is given as $(T_{3a}+T_{63})$. However, the layer 6 may not be formed on the portions 3a, in other words, the layer 6 may be formed to fill the recesses 5a and 5b only.

Each of the portions 3a is apart from the source electrode 8a of the corresponding TFT 2 at a specific distance. Specifically, the minimum distance between the opposing edges of the portion 3a and the electrode 8a is defined as $D_{3a}$, which is set to be equal to or greater than the thickness $T_{3a}$ of the portions 3a, i.e., $D_{3a} \geq T_{3a}$.

Pixel electrodes 9, which have the same rectangular plan shape, are formed on the flat surface of the planarization layer 6. The electrodes 9 are located over the flat surfaces of the respective portions 3a, which are placed in the respective pixel regions R. The electrodes 9 are slightly smaller in plan shape than the portions 3a. Each of the electrodes 9 has a strip-shaped connection part 10 protruding laterally along the gate line 7 to be overlapped with the source electrode 8a of the corresponding TFT 2. Each of the connection parts 10 is located on the surface of the layer 6 too. Each of the parts 10 is connected to the source electrode 8a of the corresponding TET 2 by way of a corresponding contact hole 16 of the layer 6. Thus, the pixel electrodes 9 are electrically connected to the corresponding TETs 2.

Next, a method of fabricating the active-matrix substrate according to the first embodiment of FIGS. 4 and 5D is explained below with reference to FIGS. 5A to 5D.

First, a semiconductor layer, which is typically made of amorphous silicon or polycrystalline silicon, is formed on the surface of the transparent glass plate 1 and then, it is patterned by popular photolithography and dry-etching techniques. Thus, the semiconductor islands 12 are formed at the specific locations on the surface of the plate 1.

Thereafter, the dielectric layer 17, which is typically made of $SiO_2$, is formed on the whole surface of the plate 1 to cover the semiconductor islands 12 and patterned. Thus, the gate dielectric layers 17a are formed on the corresponding islands 12. The remaining layer 17 covers the surface of the plate 1.

A conductive layer (not shown) is formed on the dielectric layer 17 to cover the gate dielectric layers 17a and patterned, thereby forming the gate electrodes 7a on the layer 17a and the gate lines 7 on the layer 17, respectively. The gate electrodes 7a are directly connected to the respective gate lines 7. In other words, specific parts of each gate line 7 constitute the respective electrodes 7a, as seen from FIG. 4.

A proper dopant is selectively introduced into the semiconductor island 12 in self-alignment with respect to the gate electrode 7a by an ion-implantation method, thereby forming a source region and a drain region in each of the islands 12. The remaining part of each island 12 between the source and drain regions, which is located rightly below the gate electrode 7a, forms a conductive channel region.

The interlayer dielectric layer 18, which is made of $SiN_x$, is formed on the dielectric layer 17 to cover the gate electrodes 7a and the gate lines 7. Then, the layer 18 is selectively removed in the peripheral area of each island 12, forming two contact holes exposing the source and drain regions of each island 12 by way of the layers 17 and 18, respectively.

A conductive layer (not shown) is formed on the interlayer dielectric layer 18 and patterned, thereby forming the source electrodes 8a and the drain electrodes 8b of the TFTs 2, and the data lines 8 connected to the corresponding source electrodes 8a. Each of the source electrodes 8a is connected to the source region of the corresponding island 12 by way of its contact hole. Each of the drain electrodes 8b is connected to the drain region of the corresponding island 12 by way of its contact hole.

Through the above-described process steps, the TFTs 2, the gate lines 7, and the data lines 8 are formed on the plate 1. The state at this stage is shown in FIG. 5A.

Thereafter, as shown in FIG. 5B, a transparent dielectric layer 3, which is typically made of $SiO_2$ or $SiN_x$, is formed on the interlayer dielectric layer 18 to cover the TFTs 2 and the gate and data lines 7 and 8 by the CVD (Chemical Vapor Deposition) method. The layer 3 has a thickness $T_3$ of, for example, approximately 1.5 μm.

Thereafter, a photoresist film is formed on the layer 3 and patterned, thereby forming a mask 11 for forming the recesses 5a and 5b. The photoresist mask 11 has an opening 11c whose shape corresponds to the shape of cross stripes of the recesses 5a and 5b. The opening 11c has edges 11a and 11b. The state at this stage is shown in FIG. 5B.

Using the photoresist mask 11 thus formed, the underlying transparent dielectric layer 3 is selectively etched, thereby forming the recesses 5a and 5b on the plate 1. The remaining layer 3 constitutes the transparent dielectric portions or islands 3a located in the pixel regions R, as shown in FIG. 5C.

Here, it is important that the thickness $T_{3a}$ of the transparent dielectric portions 3a (this is equal to the thickness $T_3$ of the layer 3) is equal to or greater than the maximum height difference H of the TFTs 2 from the remaining area with reference to the surface of the interlayer dielectric layer 18, i.e., $T_3=T_{3a} \geq H$. This is to ensure that the TFTs 2 do not protrude upward from the remaining layer 3 or the portions 3a.

Moreover, it is important that the edge 3ab of the portion 3a is apart from the opposing edge of the source electrode 8a of the corresponding TFT 2 at a specific distance $D_{3a}$ in such a way that the portion 3a has a sufficient surface flatness. Specifically, the distance $D_{3a}$ is determined to satisfy the relationship of $D_{3a} \geq T_{3a}$, where $T_{3a}$ is the thickness of the portion 3a. This relationship is applied to the distance of the portion 3a to the gate lines 7 or the data lines 8.

The edge 3aa of the portion 3a is apart from the top of the drain electrode 8b of the corresponding TFT 2 at a greater distance than $D_{3a}$.

To accomplish the formation of the portions 3a so as to satisfy the relationship of $D_{3a} \geq T_{3a}$, the edges 11a and 11b of the mask 11 are properly determined.

If the distance $D_{3a}$, is less than the thickness $T_3$ of the layer 3 (i.e., $D_{3a}<T_3$), in other words, the edge 11b of the mask 11 is too close to the corresponding TFT 2, the end of the portion 3a is included in the inclined or raised area 15 of the layer 3. The inclined or raised area 15 is caused by the underlying TFT 2. Thus, when the portions 3 are formed by etching the layer 3 with the mask 11, the portions 3 do not have sufficiently flat surfaces.

On the other hand, if the distance $D_{3a}$ is much greater than the thickness $T_3$ of the layer 3 (i.e., $D_{3a}>>T_3$), in other words, the edge 11b of the mask 11 is too far from the corresponding TFT 2, there arises a problem that the planarization layer 6 do not have a sufficient flat surface in the recesses 5a and 5b. Alternately, there arises a problem that the utilization efficiency of light tends to degrade, because the planarization layer 6 having a less optical transmittance than the transparent layer 3 occupies a wider area.

Therefore, to ensure the desired surface flatness of the substrate and to enhance the utilization efficiency of light, the occupation area of the portions 3a needs to be clearly defined or limited. According to the inventor's test, it was found that the inclined or raised areas 15 (height: $H_{15}$) of the layer 3 are approximately equal to the thickness $T_3$ of the layer 3. Thus, the distance $D_{3a}$ is preferably set to be equal to or greater than the thickness $T_3$ of the layer 3 (or, the thickness $T_{3a}$ of the portions 3a), i.e., $D_{3a} \geq T_3=T_{3a}$. More preferably, the distance $D_{3a}$ is set to be greater than the thickness $T_3$ of the layer 3 (or, the thickness $T_{3a}$ of the portions 3a) by about 10% of $T_3$ or $T_{3a}$.

In the first embodiment, the thickness $T_3$ of the layer 3 is set at approximately 1.5 μm. However, the value of $T_3$ may be optionally changed as desired dependent on the structure of the TFTs 2, the thickness and/or shape of the respective parts of the substrate. It is sufficient that the thickness $T_3$ of the layer 3 (or, the thickness $T_3$, of the portions 3a) is equal to or greater than the maximum height H of the TFTs 2, or the gate or data lines 7 or 8. At the same time as this, the thickness $T_3$ or $T_{3a}$ is preferably set not to be too thick, because the occupation area of the portions 3a is made as wide as possible.

The material of the transparent dielectric layer 3 is not limited to $SiO_2$ and $SiN_x$. It may be made of any transparent, dielectric material. The formation method of the layer 3 is not limited to the CVD method. Any other method may be used for this purpose. The layer 3 may be formed by a single process or processes.

After the recesses 5a and 5b and the transparent portions 3a are formed on the plate 1, an organic material is coated to cover the whole surface of the plate 1 by the spin coating method, forming the organic planarization layer 6, as shown in FIG. 5C. The layer 6 has a thickness $T_{63}$ of, for example, approximately 300 nm on the portions 3a. The layer 6 is formed to planarize the whole surface of the substrate by filling the recesses 5a and 5b.

Since the transmittance of the layer 6 is generally less than that of the layer 3 (i.e., the portions 3a), it is preferred that the layer 6 on the portions 3a is as thin as possible. However, if the layer 6 is too thin on the portions 3, the layer 6 itself is difficult to be formed uniformly and at the same time, the layer 6 has a bad coverage at the corners 3aa and/or 3ab of the portions 3a, resulting in exposure of the corners 3aa and/or 3ab from the layer 6. Thus, the thickness of the layer 6 on the portions 3a is preferably set near the above-identified value.

The layer 6 may be formed not to cover the surfaces of the portions 3a. In this case, the layer 6 fills only the recesses 5a and 5b.

Thereafter, the planarization layer 6 is selectively etched to form contact holes 16 that expose the source electrodes 8a of the corresponding TFTs 2, as shown in FIG. 5C.

A transparent conductive layer (e.g., an ITO layer) is then formed on the planarization layer 6 and patterned, forming the pixel electrodes 9 over the portions 3. The pixel electrodes 9 have the strip-shaped connection parts 10. The parts 10 of the pixel electrodes 9 are contacted with and electrically connected to the corresponding source electrodes 8a of the TFTs 2 by way of the contact holes 16 of the layer 6. Thus, the active-matrix substrate according to the first embodiment is fabricated, as shown in FIG. 5D.

With the active-matrix substrate of FIGS. 4 and FIGS. 5A to 5D according to the first embodiment of the invention, as described above, the protruding regions (i.e., the TFTs 2, the gate lines 7, and the data lines 8) are located in the recesses 5a and/or 5b. The recesses 5a and 5b are formed by the transparent dielectric portions or islands 3a arranged on the plate 1. The thickness $T_{3a}$ of the portions 3a is equal to or greater than the maximum height of the protruding regions (here, the height H of the TFTs 2), i.e., $T_{3a} \geq H$. The portions 3a have flat surfaces. The distance $D_{3a}$ between the TFTs 2 and the corresponding portions 3a is equal to or greater than the thickness $T_{3a}$ of the portions 3a, i.e., $D_{3a} \geq T_{3a}$. Thus, the occupation area of the portions 3a is much wider than that of the recesses 5a and 5b.

Furthermore, the planarization layer 6 is formed to fill the recesses 5a and 5b, thereby planarizing approximately the whole surface of the plate 1. The layer 6 has a flat surface. The connection lines 10 of the pixel electrodes 9 are formed on the flat surfaces of the portions 3a and the layer 6.

Accordingly, the flatness of the whole surface of the plate 1 or the substrate of the first embodiment can be improved. This means that the surface unevenness of the substrate due to the height difference of the TFTs 2 and the gate and data lines 7 and 8 is suppressed effectively.

Moreover, the TFTs 2 can be formed on the plate 1 by using ordinary fabrication processes before the transparent dielectric portions 3a are arranged in a matrix array on the plate 1. In other words, the TFTs 2 are formed on the flat surface of the plate 1 without the portions 3a. Thus, the difficulty in controlling the dimensional accuracy for the formation of the TFTs 2 can be eliminated.

The TFTs 2 can be formed on the plate 1 before the transparent dielectric portions 3 are arranged on the plate 1 and thus, dielectric layers are not stacked along the sidewalls of the portions 3a during the fabrication process sequence. This means that undesired reflection and/or refraction of the exposing light will not occur near the sidewalls of the portions 3a. As a result, quality degradation of displayed images is prevented.

SECOND EMBODIMENT

Figure 6A:
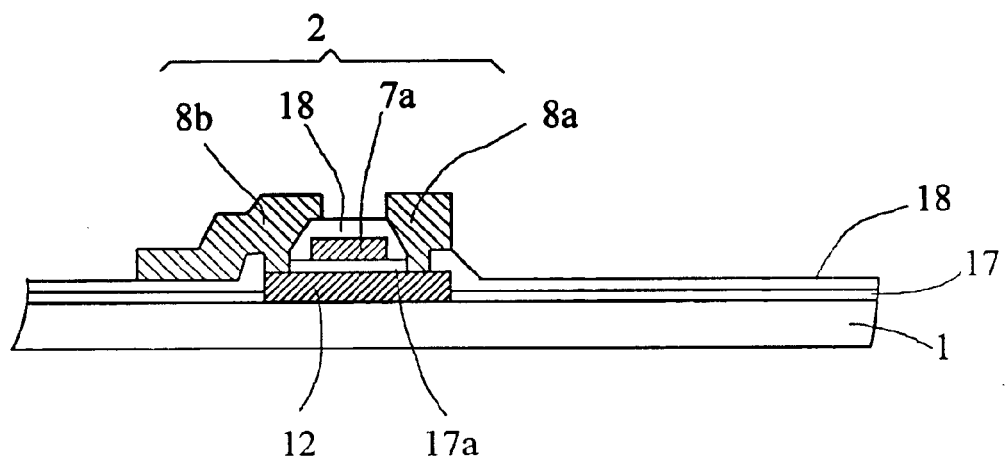
FIGS. 6A to 6D are schematic, partial cross-sectional views along the line VD—VD in FIG. 4, which show a method of fabricating an active-matrix substrate according to a second embodiment of the invention, respectively.
Figure 6B:
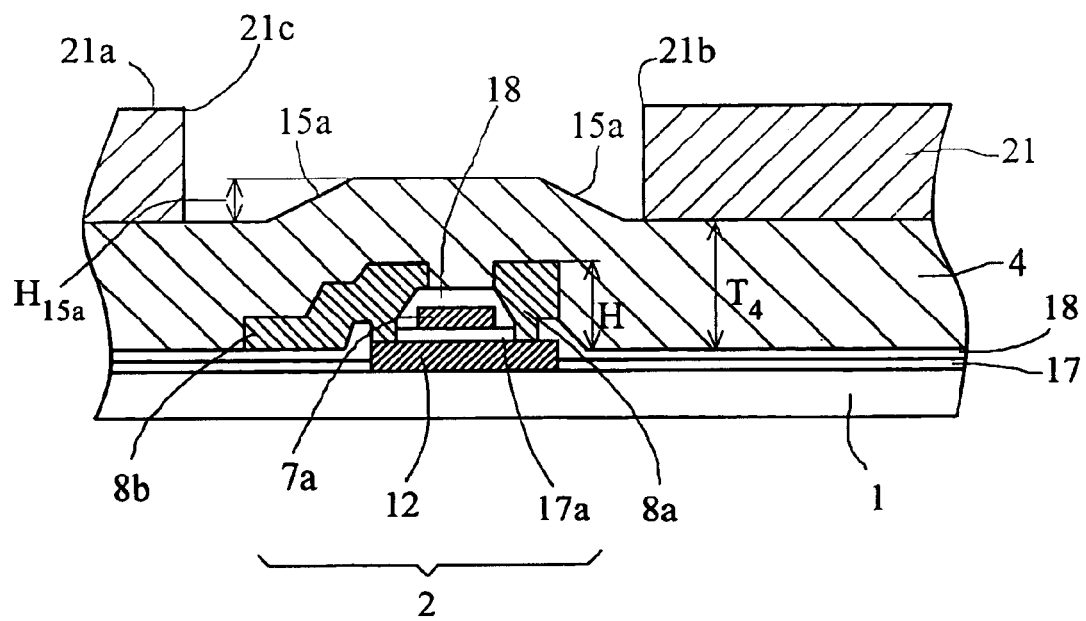
Figure 6C:
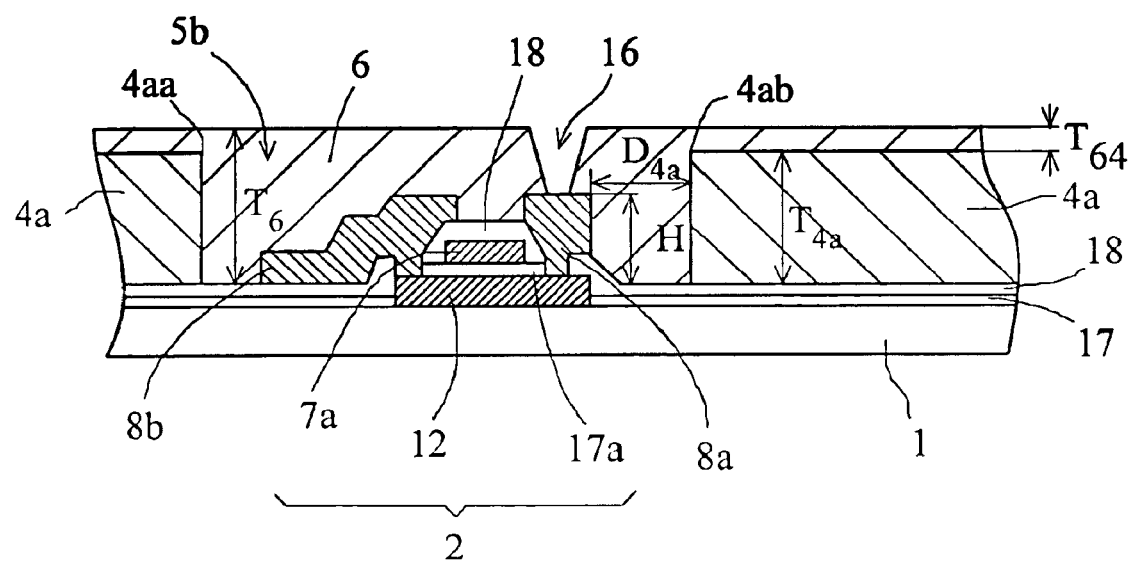
Figure 6D:
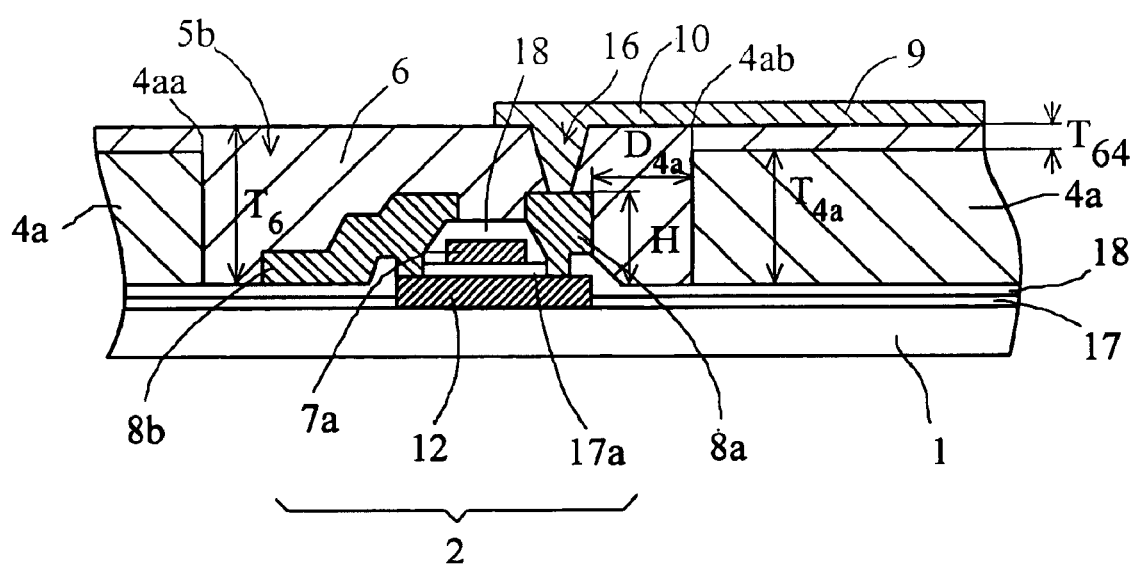

An active-matrix substrate according to a second embodiment of the invention has the configuration as shown in FIG. 4 and FIG. 6D. This substrate has the same configuration as that of the first embodiment except that the transparent dielectric layer 3 made of an inorganic material such as $SiO_2$ and $SiN_x$ is replaced with a transparent dielectric layer 4 made of an organic material. Therefore, the explanation about the same configuration is omitted here for the sake of simplification.

The active-matrix substrate according to the second embodiment is fabricated by the following method.

First, the TFTs 2, the gate lines 7, and the data lines 8 are formed on the transparent glass plate 1 in the same way as the first embodiment, as shown in FIG. 6A.

Thereafter, a transparent dielectric layer 4, which is made of an organic material, is formed on the interlayer dielectric layer 18 to cover the TFTs 2 and the gate and data lines 7 and 8 by the coating method. The layer 4 has a thickness $T_4$ of, for example, approximately 1.5 μm.

Thereafter, a photoresist film is formed on the layer 4 and patterned, thereby forming a mask 21 for forming the recesses 5a and 5b. The photoresist mask 21 thus formed has an opening 21c whose shape corresponds to the shape of cross stripes of the recesses 5a and 5b. The opening 21c has edges 21a and 21b. The state at this stage is shown in FIG. 6C.

Using the photoresist mask 21 thus formed, the underlying transparent dielectric layer 4 is selectively etched, thereby forming the recesses 5a and 5b on the plate 1. The remaining layer 4 constitutes transparent dielectric portions or islands 4a located in the pixel regions R, as shown in FIG. 6C.

Here, it is important that the thickness $T_{4a}$ of the transparent dielectric portions 4a (this is equal to the thickness $T_4$ of the layer 4) is equal to or greater than the maximum height difference H of the TFTs 2 from the remaining area with reference to the surface of the interlayer dielectric layer 18, i.e., $T_4 = T_{4a} \geq H$. This is to ensure that the TFTs 2 do not protrude upward from the remaining layer 4 or the portions 4a.

Moreover, it is important that the edge 4ab of the portion 4a is apart from the opposing edge of the source electrode 8a of the corresponding TFT 2 at a specific distance $D_{4a}$ in such a way that the portion 4a has a sufficient surface flatness. Specifically, the distance $D_{4a}$ is determined to satisfy the relationship of $D_{4a} \geq T_{4a}$, where $T_{4a}$ is the thickness of the portion 4a. This relationship is applied to the distance of the portion 4a to the gate lines 7 or the data lines 8.

The edge 4aa of the portion 4a is apart from the top of the drain electrode 8b of the corresponding TFT 2 at a greater distance than $D_{4a}$.

To accomplish the formation of the portions 4a so as to satisfy the relationship of $D_{4a} \geq T_{4a}$, the edges 21a and 21b of the mask 21 are properly determined.

In the second embodiment, the thickness $T_4$ of the layer 4 is approximately 1.5 μm. However, the value of $T_4$ may be changed as desired dependent on the structure of the TFTs 2, the thickness and/or shape of the respective parts of the substrate.

The material of the transparent dielectric layer 4 may be made of any organic transparent, dielectric material. The formation method of the layer 4 is not limited to the coating method. Any other method may be used for this purpose.

Since the organic layer 4 has a greater fluidity than the inorganic layer 3 used in the first embodiment, the height $H_{15a}$ of the inclined or raised areas 15a of the layer 4 is less than the height $H_{15}$ of the areas 15 of the layer 3 in the first embodiment by approximately 20a. Thus, the areas 15a are narrower than the area 15. This means that the distance between the edges 21b and 21c of the mask is decreased and that the occupation area of the portions 4a is increased, compared with the first embodiment.

After the recesses 5 and the portions 4a are formed on the plate 1, an organic planarization layer 6 is formed to cover the whole surface of the plate 1 by the spin coating method, as shown in FIG. 6C. The layer 6 is made of the same organic material as the layer 4. At this state, the thickness $T_6$ of the layer 6 is determined in such a way that the thickness $T_{64}$ on the portions 4a is approximately 300 nm.

The layer 6 is formed to planarize the whole surface of the substrate by filling the recesses 5a and 5b. Since the layer 6 is made of the same organic material as the layer 4, the transmittance and the refractive index of the layer 6 are the same as those of the portions 4a.

If the layer 6 is too thin on the portions 4a, the layer 6 itself is difficult to be formed uniformly and at the same time, the layer 6 has a bad coverage at the corners 4aa and/or 4ab of the portions 4a, resulting in exposure of the corners 4aa and/or 4ab from the layer 6. Thus, the thickness $T_{64}$ of the layer 6 on the portions 4a is preferably set near the above-identified value.

The viscosity of the layer 6 may be equal to or different from that of the layer 4.

Following this step, the planarization layer 6 is selectively etched to form the contact holes 16 that expose the corresponding source electrodes 8a of the TFTs 2, as shown in FIG. 6C.

A transparent conductive layer is then formed on the planarization layer 6 and patterned, forming the pixel electrodes 9 over the portions 4a. The connection parts 10 of the pixel electrodes 9 are contacted with and electrically connected to the corresponding source electrodes 8a of the TFTs 2 by way of the contact holes 16. Thus, the active-matrix substrate according to the second embodiment is fabricated, as shown in FIG. 6O.

With the above-described active-matrix substrate of FIGS. 4 and FIGS. 6A to 6D according to the second embodiment of the invention, the following advantages are obtainable along with the same advantages as those of the first embodiment.

Since the organic planarization layer 4 is formed by coating to cover the TFTs 2 and the gate and data lines 7 and 8 in the recesses 5a and 5b in the step of FIG. 5B, the thickness of the organic planarization layer 4 over the TFTs 2 is less than the inorganic planarization layer 3 used in the first embodiment. This means that the inclination areas 15a of the layer 4 are narrower than the inclination areas 15 of the layer 3 in the first embodiment.

Accordingly, the distance $D_{4a}$ between the source electrode 8a of the TFT 2 and the opposing edge 4ab of the portion 4a is less than the distance $D_{3a}$ between the source electrode 8a of the TFT 2 and the opposing edge 3ab of the portion 3a in the first embodiment. As a result, the portions 4a (and therefore, the pixel electrodes 9) can be formed to be wider than the portions 3a in the first embodiment. This leads to increase in aperture ratio.

Moreover, with the substrate of the first embodiment, each pixel electrode 9 is located on the stacked structure of the inorganic transparent dielectric portion 3a and the organic planarization layer 6. Therefore, there is a possibility that the optical transmittance degrades at the interface of the portion 3a and the layer 6 due to the refractive index difference. Unlike this, with the substrate of the second embodiment, each pixel electrode 9 is located on the stacked structure of the organic transparent dielectric portion 4a and the organic planarization layer 6, where the portion 4a and the layer 6 are made of the same organic material. Therefore, the optical transmittance degradation at the interface of the portion 4a and the layer 6 is effectively suppressed.

THIRD EMBODIMENT

Figure 7:
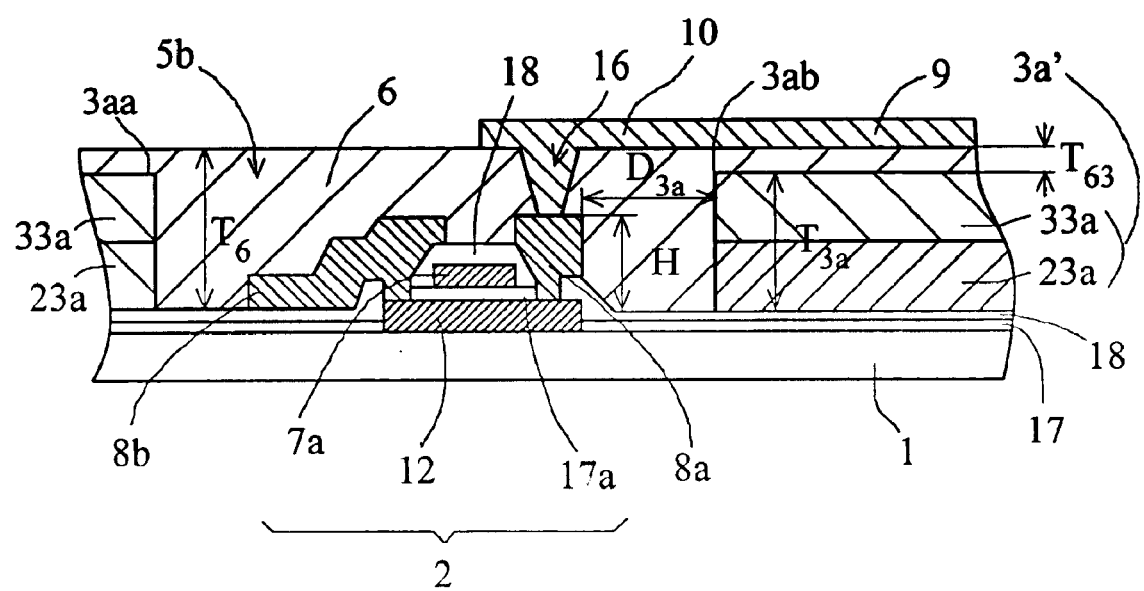
FIG. 7 is a schematic, partial cross-sectional view along the line VD—VD in FIG. 4, which show the configuration of an active-matrix substrate according to a third embodiment of the invention, respectively.

FIG. 7 shows an active-matrix substrate according to a third embodiment of the invention. This substrate has the same configuration as the substrate of the first embodiment of FIG. 4 and FIG. 5D, except that the transparent dielectric portions 3a are replaced with transparent dielectric portions 3a' with a two-layer structure of a lower $SiO_2$ sublayer 23a and an upper $SiN_x$ sublayer 33a.

The layer 3a' is formed by the process of forming the lower $SiO_2$ sublayer 23a and the process of forming the upper $SiN_x$ sublayer 33a. The other process steps are the same as the method of the first embodiment.

In the substrate of the third embodiment, the portions 3a' are formed by the different materials (i.e., $SiO_2$ and $SiN_x$). Therefore, there is an additional advantage that the sublayers 23a and 33a are stacked in such a way as to absorb the stresses existing therein, relaxing the stresses in the whole portions 3a', along with the same advantages as the substrate in the first embodiment.

VARIATIONS

Needless to say, the present invention is not limited to the above-described first to third embodiments. Any change or modification may be added to the configurations of the active-matrix substrate and the method of fabricating the same within the spirit of the invention.

For example, although the TFT 2 is of the non-inverted staggered type in the above-described embodiments, the TFT 2 may be of the inverted staggered type. The invention may be applied to any method of driving the liquid crystal confined between the active-matrix substrate and the opposing substrate, for example, the Twisted Nematic (TN) and In-Plane Switching (IPS) methods. The invention is applicable to the so-called CFonTFT structure where the color filter is placed on the active-matrix substrate.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. An active-matrix substrate comprising:
   (a) a transparent dielectric base;
   (b) gate lines arranged at intervals on the base;
   (c) data lines arranged at intervals on the base to intersect with the gate lines, forming intersections;
   (d) TFTs arranged near the respective intersections of the gate lines and the data lines;
   (e) transparent dielectric portions arranged in a matrix array on the base in such a way as to form a first plurality of recesses extending along the respective gate lines and a second plurality of recesses extending along the respective data lines;
      each of the portions forming a pixel regions with a flat surface;
      each of the portions having a thickness equal to or greater than a maximum height of the TFTs, the gate lines, or the data lines with respect to a specific reference level;
      each of the portions having a distance equal to or greater than the thickness thereof from a corresponding one of the TFTs, the gate lines, or the data lines;
   (f) a planarization layer selectively formed to fill at least the first plurality of recesses and the second plurality of recesses; and
   (g) pixel electrodes arranged on or over the flat surfaces of the respective portions;
      each of the pixel electrodes having a connection part formed on the surface of the planarization layer to extend over a corresponding one of the second plurality of recesses;
      the connection part being connected to a corresponding one of the TFTs by way of a corresponding one of holes of the planarization layer.

2. The substrate according to claim 1, wherein each of the transparent dielectric portions is made of a same material as the planarization layer.

3. The substrate according to claim 1, wherein each of the transparent dielectric portions is made of a material having substantially a same refractive index as that of the planarization layer.

4. The substrate according to claim 1, wherein each of the transparent dielectric portions has a multi-layer structure of sublayers stacked, and the sublayers are made of a same material as each other.

5. The substrate according to claim 1, wherein each of the transparent dielectric portions has a multi-layer structure of sublayers stacked, the sublayers being made of different materials from each other.

6. The substrate according to claim 1, wherein each of the transparent dielectric portions includes a layer made of one selected from the group consisting of $SiO_2$, $SiN_x$, and an organic planarization material.

7. The substrate according to claim 1, wherein each TFT is in a first recess of said first plurality of recesses extending along a respective gate line and a second recess of said second plurality of recesses extending along a respective data line, said respective gate line and said respective data line forming the respective intersection which the TFT is arranged near.

8. The substrate according to claim 1, wherein a height of said flat surface of each transparent dielectric portion, relative to a surface of said transparent dielectric base, is equal to or greater than a maximum height of the TFTs, the gate lines, and the data lines, relative to said surface of said transparent dielectric base.

9. An active-matrix substrate comprising:
   (a) a transparent dielectric base;
   (b) sate lines arranged at intervals on the base;
   (c) data lines arranged at intervals on the base to intersect with the gate lines, forming intersections;
   (d) TFTs arranged near the respective intersections of the gate lines and the data lines;

(e) transparent dielectric portions arranged in a matrix array on the base in such a way as to form a first plurality of recesses extending along the respective gate lines and a second plurality of recesses extending along the respective data lines;

each of the transparent dielectric portions forming a pixel regions with a flat surface;

each of the transparent dielectric portions having a thickness equal to or greater than a maximum height of the TFTs, the gate lines, or the data lines with respect to a specific reference level;

each of the transparent dielectric portions is at least a distance D away from the nearest of the TFTs, the gate lines, and the data lines;

wherein the transparent dielectric portions have a maximum thickness T, and wherein D is equal to or greater than T;

(f) a planarization layer selectively formed to fill at least the first plurality of recesses and the second plurality of recesses; and (g) pixel electrodes arranged on or over the flat surfaces of the respective portions;

each of the pixel electrodes having a connection part formed on the surface of the planarization layer to extend over a corresponding one of the second plurality of recesses;

the connection part being connected to a corresponding one of the TFTs by way of a corresponding one of holes of the planarization layer.

10. The substrate according to claim 9, wherein a maximum thickness of said planarization layer is equal to or greater than T.

11. The substrate according to claim 9, wherein each of the transparent dielectric portions is made of a same material as the planarization layer.

12. The substrate according to claim 9, wherein each of the transparent dielectric portions is made of a material having substantially a same refractive index as that of the planarization layer.

13. The substrate according to claim 9, wherein each of the transparent dielectric portions has a multi-layer structure of sublayers stacked, and the sublayers are made of a same material as each other.

14. The substrate according to claim 9, wherein each of the transparent dielectric portions has a multi-layer structure of sublayers stacked, the sublayers being made of different materials from each other.

15. The substrate according to claim 9, wherein each of the transparent dielectric portions includes a layer made of one selected from the group consisting of $SiO_2$, $SiN_x$, and an organic planarization material.

16. The substrate according to claim 9, wherein each TFT is in a first recess of said first plurality of recesses extending along a respective gate line and a second recess of said second plurality of recesses extending along a respective data line, said respective gate line and said respective data line forming the respective intersection which the TFT is arranged near.

17. The substrate according to claim 9, wherein a height of said flat surface of each transparent dielectric portion, relative to a surface of said transparent dielectric base, is equal to or greater than a maximum height of the TFTs, the gate lines, and the data lines, relative to said surface of said transparent dielectric base.

* * * * *

UNITED STATES PATENT AND TRADEMARK OFFICE
CERTIFICATE OF CORRECTION

PATENT NO.        : 6,774,399 B2
APPLICATION NO.   : 10/095074
DATED             : August 10, 2004
INVENTOR(S)       : Kazumi Hirata Page 1 of 1

It is certified that error appears in the above-identified patent and that said Letters Patent is hereby corrected as shown below:

Title Page;

Under REFERENCES CITED at (56):

Add the following references:
US 4,069,970
US 4,209,846
US 4,933,940
US 4,939,694
US 5,459,742
US 5,745,673
US 5,848,076
US 5,987,573
US 6,166,944
EP 0,494,547
EP 0,918,334
Abstract of Japanese Patent No. JP60007698, published January 16, 1985.
Peterson, W.W. and E.J. Weldon, Jr., Error-Correcting Codes, Second Edition, MIT Press, Ch. 1-3,8 and 9 (1994).
Reed-Solomon Codes and Their Applications, S.B. Wicker and V.K. Bhargava, ed., IEEE Press, New York, Ch. 1, 2, 4 and 12 (1994).

Signed and Sealed this
Twelfth Day of July, 2011

David J. Kappos
*Director of the United States Patent and Trademark Office*